United States Patent [19]

Hehl

[11] Patent Number: 4,468,573
[45] Date of Patent: Aug. 28, 1984

[54] PROXIMITY SWITCH ASSEMBLY WITH MULTIPLE INTERCHANGEABLE SWITCH CORES

[76] Inventor: Karl Hehl, Arthur-Hehl-Strasse 32, 7298 Lossburg 1, Fed. Rep. of Germany

[21] Appl. No.: 367,801

[22] Filed: Apr. 12, 1982

[30] Foreign Application Priority Data

Apr. 11, 1981 [DE] Fed. Rep. of Germany ....... 3114792

[51] Int. Cl.³ .............................................. H01F 15/02
[52] U.S. Cl. ..................................... 307/113; 307/116
[58] Field of Search ............... 307/113, 115, 116, 117; 338/32 H; 336/92; 340/551, 552, 561; 382/64; 235/440, 449

[56] References Cited

U.S. PATENT DOCUMENTS 3,743,853 7/1973 Dittman et al. ...................... 307/116
4,090,091 5/1978 Brown et al. ........................ 307/116
4,326,197 4/1982 Euin ................................ 307/116 X Primary Examiner—Joseph W. Hartary
Assistant Examiner—Derek Jennings
Attorney, Agent, or Firm—Joseph A. Geiger

[57] ABSTRACT

A proximity switch assembly with multiple interchangeable switch cores arranged in a row inside a switch housing in such a way that the sensor heads of the switch cores reach through sensor head bores into flush alignment with a sensor head wall, two bus bars which supply current to the switch cores being clamped between shoulders of the switch cores and the sensor head wall on opposite sides of the sensor heads and engaged by contact sleeves in the core shoulders, the bus bars being U-shaped and forming male contact prongs at their extremities. The switch housing has a fitting cover and flanges for mounting attachment in two different orientations.

10 Claims, 6 Drawing Figures

PROXIMITY SWITCH ASSEMBLY WITH MULTIPLE INTERCHANGEABLE SWITCH CORES

BACKGROUND OF THE INVENTION

1. Field of the Invention

The present invention relates to proximity switches and, more particularly, to a proximity switch assembly featuring a plurality of switch cores which are interchangeably arranged in common switch housing and designed for switching actions in response to the movement of switching elements past the switch cores at a close distance.

2. Description of the Prior Art

It is known from the prior art in this field to arrange a plurality of proximity switches side-by-side in a row, as part of the operational controls of a machine, the switches serving as limit switches for movements of a production machine such as a plastics injection molding machine, for example. In such an arrangement, each proximity switch has separate positive and negative terminals for its current supply and a signal terminal for the transmission of control pulses generated by the proximity switch.

The replacement of a proximity switch thus requires the disconnection of all three conductors from the switch and the subsequent reconnection of the conductors to the new switch in the correct order. In the case of a bank of proximity switches, the number of electrical conductors can be considerable and the risk of an error in the wiring connections at the time of initial assembly or at the time of replacement of one or more switches in the field is a real one. The latter is especially true, when a complex processing machine is to be serviced in a country which has an acute shortage of qualified operating and servicing personnel.

SUMMARY OF THE INVENTION

It is the primary objective of the present invention to suggest an improved arrangement of a plurality of proximity switches which offers savings in production costs, especially in terms of assembly simplification and speedup, and which also offers a greatly simplified procedure for the replacement of a defective switch, so that such replacement can be performed by personnel of limited skill, without risk to the operational safety of the machine.

The present invention proposes to attain this objective by suggesting a novel arrangement for interchangeably mounting the cores of a plurality of proximity switches in a common switch housing, where the switch housing has a flat sensor head wall with a row of sensor head bores through which the sensor heads of the switch cores reach into flush alignment with the sensor head wall, and where two bus bars are arranged on the inner side of the sensor head wall, on opposite sides of the row of sensor head bores and connected to a common source of current, and the switch cores have core shoulders reaching over the two bus bars, engaging them with conductive sleeves. Threaded fasteners reach through the conductive sleeves and through the bus bars to clamp the switch cores to the sensor head wall.

In a preferred embodiment of the invention, the switch housing is of injection-molded plastic, having a rectangular outline with a fitting housing cover. The sensor heads fit sealingly into the sensor head bores, thereby centering the switch cores.

The invention further suggests that the two bus bars be U-shaped in outline, with upstanding leg portions forming standardized male contact prongs at their extremities and that the signal terminals of the switch cores be likewise in the form of standardized male contact prongs. Matching female wire terminals serve to establish detachable electrical connections.

The switch housing of the invention is preferably so arranged that it has two alternative mounting faces, one being the outer surface of the housing cover and the other being defined by a housing end wall flanked by longitudinal end flanges, this second mounting face oriented at right angles to the first mounting face.

BRIEF DESCRIPTION OF THE DRAWINGS

Further special features and advantages of the invention will become apparent from the description following below, when taken together with the accompanying drawing which illustrates, by way of example, a preferred embodiment of the invention, represented in the various figures as follows.

DESCRIPTION OF THE PREFERRED EMBODIMENT

Figure 1:
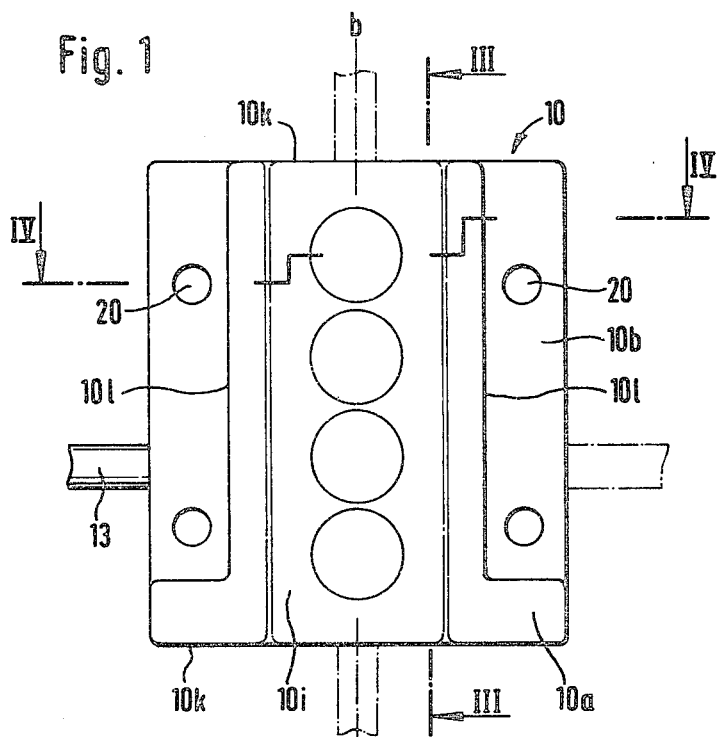
FIG. 1 shows, in a plan view, a proximity switch assembly with multiple interchangeable switch cores embodying the present invention.
Figure 3:
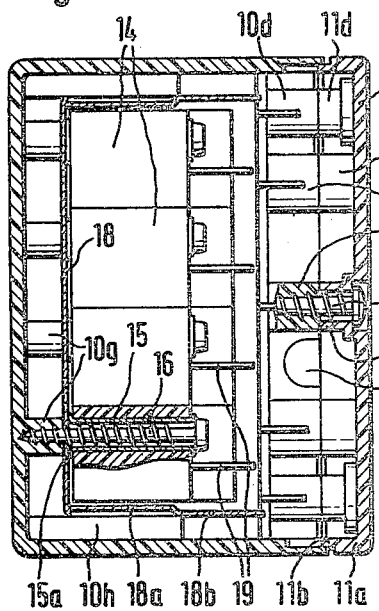
FIG. 3 shows the switch assembly of FIG. 1 in a longitudinal cross section taken along line III—III of FIG. 1.
Figure 5:
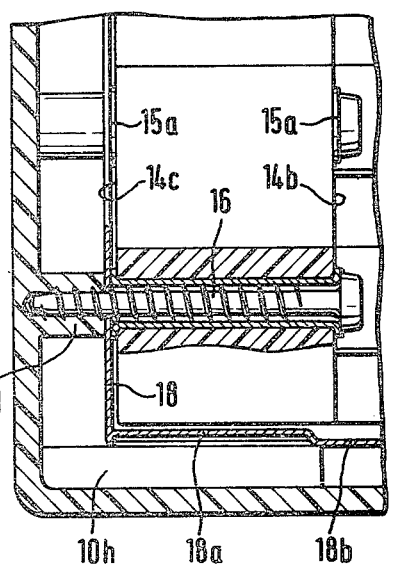
FIG. 5 shows an enlarged detail of FIG. 3.

FIGS. 1 and 3 show a switch housing 10, preferably injection-molded of plastic material, inside which are arranged four switch cores 14. The switch cores 14, themselves embedded in rectangular plastic blocks, are arranged in a row in the center of the switch housing 10, in symmetrical alignment with the longitudinal center plane b—b of the latter. The four switch cores 14 adjoin each other with minimal insertion clearance between their longer sides.

The sensor heads 14a of the switch cores 14 reach axially through the sensor head wall 10i of the switch housing 10. The end faces of the inserted cylindrical sensor heads 14a are flush with the outer surface of the sensor head wall 10i, so as to respond with an inductive switching pulse, when a switching element (not shown) moves past the sensor head 14a at a close distance, but without actually touching the switch assembly.

The drawing shows that the switch housing 10 is pot-shaped and of generally rectangular outline, having parallel longitudinal housing walls 10l. These walls define an interior space which is slightly wider than the longer, transverse dimension of the switch cores 14, for the convenient insertion of the switch cores 14 along the switch core axis a—a. The sensor head bores in the sensor head wall 10i are formed by the inner walls of sleeve extensions 10e on the inside of the sensor head wall 10i.

Figure 4:
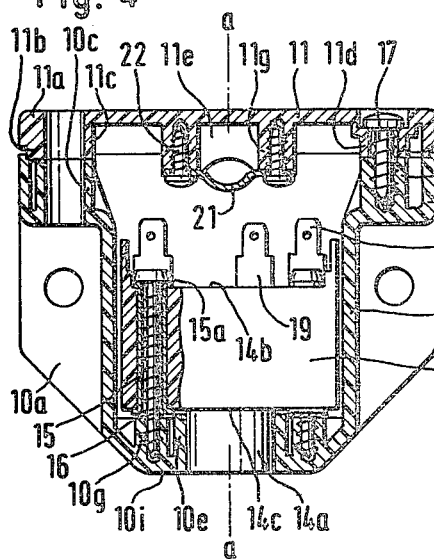
FIG. 4 shows the switch assembly of FIG. 1 in a transverse cross section taken along line IV—IV of FIG. 1.
Figure 6:
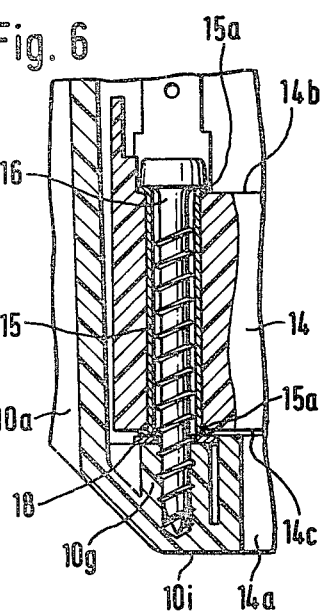
FIG. 6 shows an enlarged detail of FIG. 4.

As can be seen in FIG. 4, the transverse cross section of the switch housing 10, formed by the two longitudinal walls 10*l* and the sensor head wall 10*i*, widens opposite the wall 10*i* to form two longitudinal mounting flanges 10*b*. The end walls 10*k* of the switch housing 10 and the outer edges of the mounting flanges 10*b* form a rectangular open end of the housing which is covered by a housing cover 11 which is described in more detail further below.

In order to have the possibility of an alternative mounting attachment of the switch assembly at a right angle from the mounting attachment provided by the mounting flanges 10*b* and the housing cover 11, the switch housing 10 further includes two mounting flanges 10*a* at one longitudinal extremity of the switch housing 10, the mounting flanges 10*a* forming lateral extensions of the end wall 10*k* of the switch housing 10. The mounting flanges 10*b* have two throughbores 20 arranged at the same spacing as the throughbores 20 which extend through the mounting flanges 10*b* and the housing cover 11.

On the inner side of the sensor head wall 10*i*, on laterally opposite sides of the row of sensor head 14*a*, are arranged two flat bus bars 18. They are positioned against the inner end faces of eye extensions 10*e*, and their inner edges abut against the sleeve extensions 10*e* of the sensor head bores which are slightly higher than the eye extensions 10*e*.

As can be seen in FIGS. 3 through 6, the two bus bars 18 are of flat metal stock and bent into a U-shaped configuration with upstanding leg portions 18*a* in the area of the end walls 10*k* of the switch housing 10. There, the switch housing 10 forms shallow, rectangular centering grooves 10*h* inside which the leg portions 18*a* of the bus 18 are positioned. During assembly, the four centering grooves 10*h* also serve as insertion guides for the bus bars 18. For enhanced stiffness, the upstanding leg portions 18*a* of the bus bars 18 are slightly upset against the end walls 10*k* of the switch housing 10.

At their extremities, the upstanding leg portions 18*a* of the two bus bars 18 form standardized male contact prongs 18*b* for the detachable connection thereto of standardized female conductor terminals (not shown). The signal terminals of the four switch cores 14 are likewise in the form of standardized male contact prongs, as can be seen at 19.

The block-shaped portion of each switch core 14 forms core shoulders on opposite sides of the sensor head 14*a* which reach laterally over the two bus bars 18. In alignment with the bus bars 18, each switch core 14 carries a pair of conductive sleeve 15 in its core shoulders in parallel alignment with the switch core axis a—a.

The conductive sleeves 15 also serve as hollow rivets, their extremities being formed into contact collars 15*a* which protrude from the top surface 14*b* and the bottom surface 14*c*. Reaching through each conductive sleeve 15 and through an aligned bore in the bus bars 18 is a clamping screw 16 which is threaded into an eye extension 10*e* of the sensor head wall 10*i*. The heads of the screws 16 bear against the upper contact collars 15*a* of the conductive sleeves 15, thereby clamping the lower contact collars 15*a* against the bus bars 18, for permanent electrical contact. At the same time, the bus bars 18 are clamped between the core shoulder and the sensor head wall 10*i* of the switch housing 10.

Facing the rectangular opening of the switch housing 10, which is formed by the outer walls of the mounting flanges 10*b* and the end walls 10*k*, is a housing cover 11 which has a matching rectangular outline. The rim 11*a* of the housing cover 11 has a lip in the form of a peripheral ridge 11*b* which reaches into a matching peripheral recess in the rim of the switch housing 10, so that the housing cover 11 is outwardly flush with the switch housing 10.

This structure makes it possible to provide a hermetic closure between the switch housing 10 and the housing cover 11 which, in combination with an O-ring seals between the sensor heads 14*a* and the sensor head bores in the sensor head wall 10*i*, renders the switch assembly waterproof.

As can be seen in FIG. 4, the housing cover 11 is attached to the switch housing 10 by means of screws 17 which engage threaded eye extensions 10*d* formed on the inside of the mounting flanges 10*b* of the switch housing 10. For this purpose, the housing cover 11 has aligned eye extensions 11*d* with throughbores. Similar slightly larger eye extensions 10*c* in the mounting flanges 10*b* of the switch housing 10 and aligned eye extensions 11*c* in the housing cover 11 surround the throughbores 20 which are mentioned further above in connection with one of the two alternative mounting attachments of the switch assembly.

Figure 2:
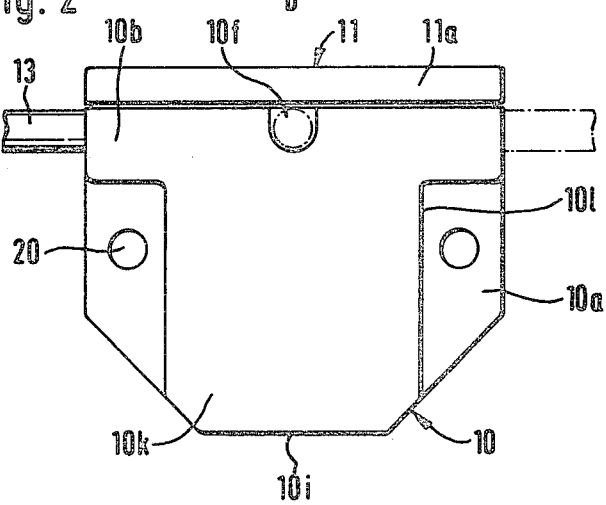
FIG. 2 shows the switch assembly of FIG. 1 in an end view.

FIGS. 1 and 2 show that the cable 13 enters the switch housing 10 from one side, while stippled lines indicate three other possible directions in which the entry of the cable 13 could be arranged. This is made possible by the arrangement of an optional aperture 10*f* in each of the three alternative entry locations (see also FIG. 3). The optional apertures 10*f* are defined by areas in the longitudinal housing walls 10*l* and in the end walls 10*k* which are reduced to a thin residual wall portion, thereby indicating the optional location of the cable entry. The injection molding die for the switch housing 10 is so arranged that, with a minor change of parts, it is possible to move the cable entry location from one optional aperture 10*f* to another.

On the underside of the housing cover 11 are further arranged two eye extensions 11*g* and a cable clamp 21. Two screws 22 pull the cable clamp 21 toward the eye extensions 11*g*, thereby clamping the cable 13 against a clamping ridge 11*e* of housing cover 11 to provide a strain relief for the cable 13. A fifth optional cable aperture (not shown) is arranged in the center of the housing cover 11. Accordingly, it is also possible for the cable 13 to enter the switch housing 10 in the direction of the switch core axis a—a.

The novel proximity switch arrangement of the present invention provides an important simplification of the assembly operation, starting with the insertion of the two bus bars 18 along the centering grooves 10*h* in the end walls 10*k*. The longitudinal portions of the inserted bus bars 18 are positioned against the eye extensions 10*g* and the sleeve extensions 10*e*. In the next assembly step, the four switch cores 14 are inserted side-by-side into the switch housing 10, the sensor heads 14*a* engaging the sensor head bores in the sensor head wall 10*i* with a clearance-free fit.

The eight clamping screws 16 not only establish an excellent electrical contact between the two bus bars 18 and both conductive sleeves 15 of each switch core 14, they also hold the bus bars 18 in place, thereby securing the upstanding leg portions 18*a* for the attachment of the female positive and negative conductors terminals of the cable 13 to their male conductor prongs 18*b*. Four female signal conductor terminals of the cable 13 are similarly inserted over the male contact prongs 19 of the four switch cores 14. The assembly thus completed, the housing cover 11 can be tightened against the switch housing 10 by means of the screws 17.

It follows that, when a defective switch core 14 is to be replaced in the field, the only electrical conductor of the cable 13 which needs to be disconnected is the one attached to the signal lead at the contact prong 19 of the defective switch core 14. The disconnected conductor is then simply switched from the defective switch core 14 to the new one and the latter is inserted into the housing 10 and tightened against the bus bars 18. This procedure is practically error-proof.

It should be understood, of course, that the foregoing disclosure describes only a preferred embodiment of the invention and that it is intended to cover all changes and modifications of this example of the invention which fall within the scope of the appended claims.

I claim the following:

1. An arrangement for interchangeably mounting the cores of a plurality of proximity switches in a common switch housing, the mounting arrangement comprising in combination;

a plastic injection-molded switch housing having an outwardly substantially flat sensor head wall with a row of sensor head bores, one for each proximity switch core;

a sensor head of a proximity switch core engaged in each sensor head bore;

a pair of bus bars arranged on the inner side of the sensor head wall of the switch housing, on opposite sides of the row of sensor head bores, the bus bars being connectable to a source of current for the simultaneous energization of all the proximity switch cores;

laterally protruding core shoulders on opposite sides of each proximity switch core reaching over the bus bars;

a conductive sleeve extending through each core shoulder in an orientation substantially perpendicular to the bus bar, one extremity of said sleeve engaging the bus bar; and a fastener reaching through each conductive sleeve and pressing the conductive sleeve against the bus bar; and wherein the proximity switch cores are centered by the engagement of their sensor heads in the sensor head bores and held in place by said fasteners; and the proximity switch cores are insertable into and removable from the switch housing from the inner side of its sensor head wall.

2. A switch core mounting arrangement as defined in claim 1, wherein the fasteners are threaded fasteners, reaching through bores in the bus bars into threaded bores of the sensor head wall, the threaded fasteners clamping the bus bars between the proximity switch cores and the sensor head wall.

3. A switch core mounting arrangement as defined in claim 2, wherein the bus bars are of flat bar stock, being bent into the shape of a "U";

the upstanding leg portions of the U-shaped bus bars engage centering recesses in opposing side walls of the switch housing; and each bus bar has on at least one of its upstanding leg portions an extremity in the form of a standardized flat male contact prong which is engageable by a matching female wire terminal.

4. A switch core mounting arrangement as defined in claim 3, wherein the proximity switch cores have upstanding signal terminals which are likewise in the form of standardized flat male contact prongs engageable by matching female wire terminals.

5. A switch core mounting arrangement as defined in claim 1, wherein the proximity switch cores are generally block-shaped, having a substantially rectangular cross section in a plane parallel to the sensor head wall, successive cores abutting each other with their longer side walls;

the sensor heads are in the form of cylindrical extensions of the proximity switch cores, being arranged with a minimal spacing between adjacent heads.

6. A switch core mounting arrangement as defined in claim 5, wherein the sensor heads of the proximity switch cores define seals with their cooperating sensor head bores and are outwardly flush with the sensor head wall; and the switch housing has a housing cover forming a substantially hermetic enclosure for the proximity switch cores.

7. A switch core mounting arrangement as defined in any one of claims 1 through 6, wherein the proximity switch cores are in the form of elongated rectangular blocks, the core shoulder being formed by the longitudinal end portions of the block; and each conductive sleeve has a flared contact collar on both of its extremities overlying opposite surfaces of a core shoulder.

8. A switch core mounting arrangement as defined in claim 1, wherein the switch housing has a generally rectangular outline, having a planar rectangular opening opposite its sensor head wall and laterally outwardly protruding mounting flanges bordering the two sides of the opening which are parallel to the row of proximity switch cores; and the switch housing includes an outwardly flat housing cover of matching rectangular outline, the housing cover and the mounting flanges of the switch housing having aligned throughbores for the insertion of fasteners by means of which the assembly is clampable to a supporting structure.

9. A switch core mounting arrangement as defined in claim 8, wherein the switch housing also has laterally outwardly protruding mounting flanges on one of its side walls, at right angles to said mounting flanges bordering its opening, for the selective support of the assembly in two orientations at right angles to each other.

10. A switch core mounting arrangement as defined in claim 8, wherein the housing includes an opening for the passage of an electrical cable, and the housing cover includes clamping means for securing the cable.

* * * * *